United States Patent

Shigemura

[11] Patent Number: 5,978,273
[45] Date of Patent: Nov. 2, 1999

[54] NON-VOLATILE SEMICONDUCTOR MEMORY DEVICE

[75] Inventor: Toshiyuki Shigemura, Tenri, Japan

[73] Assignee: Sharp Kabushiki Kaisha, Osaka, Japan

[21] Appl. No.: 09/050,317

[22] Filed: Mar. 30, 1998

[30] Foreign Application Priority Data

Jun. 6, 1997 [JP] Japan .................................. 9-149717

[51] Int. Cl.⁶ .................................................. G11C 7/00
[52] U.S. Cl. ............................... 365/185.29; 365/185.09; 365/185.22; 365/200; 365/233.5
[58] Field of Search .................... 365/185.22, 185.09, 365/185.29, 200, 233.5, 185.11, 230.03

[56] References Cited

U.S. PATENT DOCUMENTS

| | | | |
|---|---|---|---|
| 5,530,828 | 6/1996 | Kaki et al. ...................... | 365/185.29 X |
| 5,606,532 | 2/1997 | Lambrache et al. ................. | 365/200 X |
| 5,805,501 | 9/1998 | Shiau et al. ......................... | 365/185.29 |
| 5,815,441 | 9/1998 | Kobatake ............................ | 365/185.29 |
| 5,818,754 | 10/1998 | Ogura .............................. | 365/185.29 X |

FOREIGN PATENT DOCUMENTS 5-325577  12/1993  Japan .

*Primary Examiner*—Do Hyun Yoo
*Attorney, Agent, or Firm*—Morrison & Foerster, LLP

[57] ABSTRACT

A non-volatile semiconductor memory device is provided which includes a data memory block having a plurality of non-volatile memory cells, in which data in the plurality of non-volatile memory cells of the data memory block is erased before writing data into the non-volatile memory cells of the data memory block. The non-volatile semiconductor memory device further includes: an erase complete data memory region having a plurality of non-volatile memory cells which are subjected to erasure simultaneously with the plurality of non-volatile memory cells of the data memory block; a writing element for writing erase complete data including a plurality of bits into the erase complete data memory region, after erasing data in the non-volatile memory cells of the data memory block and data in the non-volatile memory cells of the erase complete data memory region; and a reading element for reading the erase complete data in the erase complete data memory region.

13 Claims, 10 Drawing Sheets

DAT0~DAT7: Data signals
RDAT    : Redundant data signal
MAT0~MAT7: Redundant data replacement signals
OUT0~OUT7: Outputs DAT0 ~ DAT7: Data signals
MAT0 ~ MAT7: Redundant data replacing signals DAT0～DAT7 : Data signals
RDAT : Redundant data signal
MAT0～MAT7 : Redundant replacement signals
OUT0～OUT7 : Outputs

PRIOR ART

NON-VOLATILE SEMICONDUCTOR MEMORY DEVICE

BACKGROUND OF THE INVENTION

1. Field of the Invention

The present invention relates to a rewritable non-volatile semiconductor memory device.

2. Description of the Related Art

As are well known in the art, EPROMs (Erasable Programmable Read-Only Memory), EEPROMs (Electrically Erasable Programmable Read-Only Memory), and the like, represent non-volatile semiconductor memory devices into which a user can rewrite data.

In the case of an EPROM, data is written using a writing element called a programmer (or a writer). In an EPROM, UV light is used to collectively erase data stored in the entire array of memory cells.

Each memory cell of an EPROM may be made from a transistor, which reduces the area of the memory cells. This is advantageous in that integration of a mass storage device becomes easy and a bit unit price may be reduced.

However, since data in an EPROM is erased by radiating UV light onto the chip, a ceramic package using expensive quartz glass is required. This limits possible reduction in the chip unit price. Moreover, since data is written by a dedicated writing device (e.g., a programmer, or a writer), an EPROM needs to be installed on a board via a chip-detachable socket. This enables the chip (i.e., EPROM) to be detached in order for the data to be written thereto and thereafter re-attached to the socket. This is not only troublesome but also undesirable in view of cost required for chip installation.

An EEPROM, on the other hand, is desirable in that data can be written and erased while the EEPROM is installed on a board. However, in order to enable writing and erasing, for example, at a bit level, a select transistor is required for each memory cell to enable the memory cell to be selected. Thus, the area required for each memory cell of an EEPROM is about 1.5 to 2 times larger than that of a memory cell in an EPROM. Accordingly, a bit unit price of an EEPROM is increased as compared to an EPROM. An EEPROM is therefore less desirable for application as a mass storage device.

A flash memory has been proposed as a non-volatile semiconductor memory device having advantages of both an EPROM and an EEPROM. A memory cell of a flash memory is disclosed, for example, in U.S. Pat. No. 4,949,158. FIG. 9 is a schematic diagram showing the structure of a memory cell within the flash memory. As shown in FIG. 9, the memory cell according to U.S. Pat. No. 4,949,158 is a floating-gate-type FET (Field Effect Transistor) which is a MOSFET (Metal Oxide Semiconductor Field Effect Transistor) in which a control gate CG is provided on a gate oxide film, with a floating gate FG being provided in the gate oxide film.

In the above-described flash memory, each memory cell is made from one transistor without any select transistor, and a plurality of memory cells are collectively erased at a chip level or at a block level. Accordingly, a bit unit price of the flash memory can be reduced as low as that of an EPROM and the flash memory is applicable as a mass storage device. Furthermore, in the same manner as an EEPROM, data can be written to and erased from the flash memory without detaching the chip from the board. In addition, since no UV light irradiation is required, an inexpensive plastic package can be used.

Generally, a NOR type flash memory and a NAND type flash memory are used. In the NOR type flash memory, transistors of memory cells (hereinafter, simply referred to as "cell transistors") are individually connected to a bit line. In a NAND type flash memory, a plurality of serially connected cell transistors are collectively connected to a bit line. Accordingly, the NAND type flash memory requires small connection areas between the bit line and the cell transistors, and thus the areas of the memory cells can be reduced. However, the access speed for reading data by random access is decreased. Other than the NOR and the NAND flash memories, there are, for example, an AND type and a DINOR type flash memory. In these AND type and DINOR type flash memories, processes of injecting electrons into and removing electrons from the floating gate FG during erase and write operations are opposite to those processes in the NOR and NAND type flash memories. For this reason, hereinafter, only NOR and NAND type flash memories will be described as examples.

In the above-described flash memories, the presence or absence of electrons within the floating gate represents data of "0" or "1".

In order to read data from each cell transistor of the flash memory, a power-supply voltage Vcc (usually about 5 V) is applied to the control gate CG while the source S is grounded (0 V) and a low voltage of about 1 V is applied to the drain D. In the case where no electrons are stored in the floating gate FG, a threshold value of the cell transistor is low such that a drain current (a channel current) flows between the drain D and the source S. In the case where electrons are stored in the floating gate FG, a threshold value of the cell transistor is high such that no drain current flows between the drain D and the source S. Accordingly, data stored in the cell transistor can be read out by detecting the magnitude of the drain current.

Hereinafter, data "0" refers to a state where the threshold value is high because electrons are stored in the floating gate FG, and data "1" refers to a state where the threshold value is low because no electrons are stored in the floating gate FG.

In reading data from the cell transistors, as described above, the voltage applied to the drain D is as low as about 1 V. Otherwise, an application of a high voltage induces undesirable parasitic weak write (soft write).

In order to erase data stored in each cell transistor of the flash memory, a high voltage of about 12 V is applied to the source S while the control gate CG is grounded. By doing so, a high electric field is generated between the floating gate FG and the source S, whereby electrons stored in the floating gate FG are removed as a tunnel current through the thin gate oxide film. Accordingly, a threshold voltage of the cell transistor is reduced, whereby the cell transistor is initialized to a state where data "1" is stored, i.e., data is erased. Such erasing of data is collectively performed on the cell transistors at a chip level or at a block level.

In order to erase data by applying a high voltage to the source S as described above, a withstand level of the source junction with respect to an applied voltage must be increased. This causes some disadvantages. For example, forming fine voltage supply lines that extend to source electrodes becomes difficult, or hot holes generated in the vicinity of the source junctions may be partially trapped in the gate oxide films, thereby deteriorating the reliability of the cell transistors.

In a method for erasing data which has overcome the above-described problem, a power-supply voltage Vcc (usually about 5 V) is applied to the source S while applying a negative voltage of about −10 V to the control gate CG so as to remove the electrons stored in the floating gate FG as a tunnel current (hereinafter, the method is referred to as "a negative gate erase method"). According to the negative gate erase method, a voltage applied to the source S is sufficiently low for the withstand level of the source junction with respect to an applied voltage to be low, and thus gate lengths of the cell transistors may be reduced.

Furthermore, according to a method where a high voltage is applied to the source S, a tunnel current that flows through the cell transistor at the time of erasing data may reach a total of several milliamps (mA) for the entire chip. Since a step-up circuit integrated in the chip has a very small current supply ability, a sufficiently high voltage cannot be supplied. Therefore, not only the power-supply voltage Vcc but also the high voltage used for erasing data needs to be supplied from an external power source. On the other hand, according to the negative gate erase method, a power-supply voltage Vcc is sufficient as a voltage applied to the source S, and thus, a high voltage is not necessary.

After erasing data stored in the cell transistors as described above, data is written into the cell transistors. In writing data into each cell transistor, a high voltage of about 12 V is applied to the control gate CG while the source S is grounded and a voltage of about 7 V is applied to the drain D. Accordingly, a large current flows between the drain D and the source S, and hot electrons with high energy generated in the vicinity of the drain junction are injected in the floating gate FG, whereby electrons are stored, i.e., data "0" is stored.

According to the above-described write operation, only the initialized data "1" is rewritten as data "0" and data "0" cannot be rewritten as data "1". Therefore, in a flash memory, an erase operation is performed to the cell transistors prior to a rewrite operation. In other words, all of the cell transistors in the chip or the block are initialized once, after which cell transistors are selected and data "0" is stored in the selected cell transistors.

In order to inject electrons into the floating gates FG by utilizing hot electrons as described above, a large current of about 1 mA needs to be supplied to each cell transistor at the time of writing. Regarding this fact, a flash memory has been developed which operates in the same manner as an EEPROM, where electrons are injected by utilizing a Fowler-Nordheim (FN) tunnel current, thereby reducing a current required at the time of writing. Accordingly, the power source is simplified in this flash memory.

In each cell transistor of a flash memory, a write operation is performed on a drain junction side and erase operation is performed on a source junction side. Accordingly, in designing the device, it is preferable that each of the junction profiles be individually optimized in accordance with their respective operations. Specifically, a field-concentration-type junction profile is applied to the drain junction so that write efficiency is enhanced, whereas a field-relaxed-type junction profile is applied to the source junction so that a high voltage is applicable at the time of erasing, whereby the drain junction profile and the source junction profile being asymmetrical.

In view of recent portable electronic apparatuses designed to operate using battery power source, or in view of the desirability of producing reduced-size semiconductors, there has been a need for a semiconductor device which can operate with a lower voltage. In order to meet such a demand, semiconductor devices in which a power-supply voltage Vcc is reduced from 5 V to 3.3 V have been vigorously developed. Accordingly, flash memories which are operable with a power source of 3.3 V have also been developed. At present, however, even in a flash memory employing a power source of 3.3 V, a voltage applied to the control gates CG of the cell transistors is supplied by stepping up a power-supply voltage Vcc from 3.3 V to 5 V by a word line step-up circuit integrated on the chip, in order to ensure high speed operation and sufficient operation margin.

The flash memory differs from RAM (Random Access Memory) in that it is capable of selectively setting various operation states such as writing and reading data, collectively erasing a plurality of memory cells at a chip level or at a block level, and reading out from a status register. In the case where these operation states are to be specified by a combination of external control signals such as a chip enable signal /CE, a write enable signal /WE, an output enable signal /OE, or the like, the number of types of control signals need to be increased compared with available EPROMs or EEPROMs. In this case, since additional input terminals are required for the corresponding control signals, the input terminals of the flash memory are no longer compatible with those of the EPROM, EEPROM or the like, thereby rendering the device less usable. Thus, according to a major command system of an actual flash memory, instead of inputting the combinations of control signals, combinations of data or addresses are input as various commands for specifying various operation states. In this case, the flash memory is provided with a command state machine (CSM) for determining each of the various externally input commands, and a write state machine (WSM) for executing the determined command.

Furthermore, the above-described flash memory in which an erase operation is performed at a block level may include blocks of various sizes or blocks of equal sizes (U.S. Pat. No. 4,945,570).

In addition, there is a flash memory in which each block is provided with a BP (Block Protect) data memory region. BP data which inhibits erase and write operations of data in the block is stored so as to protect data in the block. In this particular flash memory, /WP (Write Protect) input terminals are provided to which /WP signals are externally input. When the /WP signal is active (low), BP data in each block is validated. When the /WP signal is inactive (high), BP data in each block is invalidated. Thus, in the case where an active (low) /WP signal is input into the /WP input terminal, when BP data is stored in the BP data memory region, erase and write operations to the block are inhibited, and when BP data is not stored in the BP data memory region, erase and write operations to the block are allowed. In the case where an inactive (high) /WP signal is input into the /WP input terminal, erase and write operations to the block are allowed regardless of the presence of BP data in the BP data memory region of the block.

Instead of providing /WP input terminals, a WP setting command and a WP releasing command may be used, in which case there is no need for increasing the number of the input terminals. Specifically, when a WP setting command is input to a flash memory employing the above-described command system, a /WP signal stored in the flash memory is activated (low). When a WP releasing command is input to the flash memory employing the above-described command system, a /WP signal is inactivated (high). In this manner, the BP data in the BP data memory region is either validated or invalidated. Since /WP input terminals are not necessary in this case, compatibility between input terminals of the flash memory and input terminals of an EPROM, EEPROM or the like is maintained.

However, cell transistors of a flash memory may be in an excessive erase state where electrons are excessively removed from floating gates FG during the course of an erase operation, whereby a threshold value of the cell transistor becomes a negative voltage. Since select transistors are omitted in the cell transistors, when the threshold value of the cell transistor becomes a negative voltage during the course of the erase operation, a leakage current is generated in non-selected cell transistors which share the same bit line as the selected cell transistors during the course of a read operation. As a result, data stored in the selected cell transistors is not accurately read out, which results in a critical defect.

In order to prevent such an excessive erase in such a flash memory, a pre-write operation (Program Before Erase) is performed which provides electrons, i.e., which writes data "0", beforehand in a floating gate FG of each cell transistor which is to be subjected to an erase operation, thereby standardizing the amount of electrons in the floating gates FG of all of the cell transistors. Accordingly, in an erase operation following the above-described pre-write operation, electrons stored in the floating gates FG of all of the cell transistors are equally removed, thereby preventing electrons from being excessively removed from floating gates FG of only some of the cell transistors.

In an erase operation, after a short period of erase process, whether or not the erase process has completed is confirmed by an erase verification. The short period of erase process and erase verification are repeated until data in all of the cell transistors are completely erased. According to the above-described method, unnecessary removal of electrons from the floating gates FG of the cell transistors is prevented.

In the above-described flash memory, however, a significantly long period of time (e.g., several hundreds of milliseconds) is required for erasing data in every cell transistor. Thus, a probability of a power source being cut-off or a reset signal being received during an erase operation is increased during this long erase operation. The erase operation may be forcibly terminated as a result, and the probability of this occurring is not negligible.

When an erase operation of a cell transistor is terminated for some abnormal reason, not all of the data in the cell transistor is initialized as data "1" (where a threshold value of the cell transistor is small) and a part of data in the cell transistors will remain as data "0" (where a threshold value of the cell transistor is large). Since a write operation is only capable of rewriting initialized data "1" as data "0" as is described above, data "1" is written by remaining the initialized data "1" unchanged. Thus, when data of the cell transistors partially remain as data "0" after the erase operation, data "1" cannot be written into such cell transistors.

For this reason, the flash memory is troublesome in that a possibility of data not being completely erased for all cell transistors is a concern. This complicates programming of a system incorporating the flash memory.

Alternatively, there is a flash memory which is provided with a status register for storing a bit representing whether or not the erase operation has succeeded.

However, when the erase operation is forcibly terminated due to the cut-off of the power source or a reset of the device, the status register is reset as well. Thus, whether or not the erase operation has been successful is no longer confirmed by the register in such situation.

A counter measure against the above-described forcible termination of the erase operation is disclosed in Japanese Laid-Open Publication No. 5-325577. FIG. 10 is a block diagram showing a flash memory device according to this conventional method. Referring to FIG. 10, a flash memory card 101 includes an I/O port 102, a power control section 103, a terminal control section 104, an address latch section 105, an address control section 106, first to eighth flash memory ICs 107a to 107h, a data bus 108 connected between the I/O port 102 and each of the flash memory ICs 107a to 107h, and an address bus 109 connected between the address control section 106 and each of the flash memory ICs 107a to 107h.

In the flash memory card 101, when data stored in the first flash memory IC 107a is erased, data "0" as a flash memory IC erase complete information is written into a flash memory card final address (i.e., an erase area recording region). Furthermore, when data stored in the second flash memory IC 107b is erased, data "0" as a flash memory IC erase complete information is written into an address preceding the flash memory card final address (i.e., the erase area recording region). This process is repeated for every erase operation of the flash memory ICs 107a to 107h.

According to the above-described method, the erase complete information is 1 bit. When the erase operation is forcibly terminated due to cut-off of the power source or a reset of the device (in other words, when sequential processes of pre-writing data as "0" and initializing the pre-written data as "1" are forcibly terminated), the erase complete information cannot be specified as data "0" or "1". In this case, whether or not the erase operation has been successful cannot be confirmed.

Therefore, when the erase operation is forcibly terminated due to the cut-off of the power source or reset of the device, for example, the only way to confirm whether or not data has been successfully erased is to read out data from every cell transistor one-by-one. Since data "0" is no longer writable, the write operation should not be continued and thus additional error operation is required, thereby complicating programming of a system incorporating the flash memory.

SUMMARY OF THE INVENTION

In one aspect of the present invention, a non-volatile semiconductor memory device is provided which includes a data memory block having a plurality of non-volatile memory cells, in which data in the plurality of non-volatile memory cells of the data memory block is erased before writing data into the non-volatile memory cells of the data memory block. The non-volatile semiconductor memory device further includes: an erase complete data memory region having a plurality of non-volatile memory cells which are subjected to erasure simultaneously with the plurality of non-volatile memory cells of the data memory block; a writing element for writing erase complete data including a plurality of bits into the erase complete data memory region, after erasing data in the non-volatile memory cells of the data memory block and data in the non-volatile memory cells of the erase complete data memory region; and a reading element for reading the erase complete data in the erase complete data memory region.

According to one embodiment of the present invention, the erase complete data including the plurality of bits includes at least each one of logic values "0" and "1".

According to one embodiment of the present invention, the reading element reads the erase complete data of the erase complete data memory region in response to an erase state confirmation signal and an address transition detecting signal, where the erase state confirmation signal is predetermined, and the address transition detecting signal is formed according to a transition of an address for accessing each of the non-volatile memory cells of the data memory block.

According to one embodiment of the present invention, each of signal lines used for erasing data in the non-volatile memory cells of the erase complete data memory region and each of signal lines used for erasing data in the non-volatile memory cells of the data memory block are used mutually.

According to one embodiment of the present invention, the non-volatile semiconductor memory device further includes a determining element which, when the erase complete data read from the erase complete data memory region by the reading element is the same as the erase complete data written into the erase complete data memory region by the writing element, determines that erasing data in the non-volatile memory cells of the data memory block has been successfully completed, and, when the erase complete data read from the erase complete data memory region by the reading element is not the same as the erase complete data written into the erase complete data memory region by the writing element, determines that erasing data in the non-volatile memory cells of the data memory block has been a failure.

According to one embodiment of the present invention, the determining element outputs a result indicating that erasure of data in each non-volatile memory cell of the data memory block has been successfully completed or has been a failure, in response to an erase state confirmation signal and an address transition detecting signal, where the erase state confirmation signal is predetermined, and the address transition detecting signal is formed according to a transition of an address for accessing each of the non-volatile memory cells of the data memory block.

According to one embodiment of the present invention, some of non-volatile memory cells of the erase complete data memory region are used as a protect data memory region, and block protection data indicating a protection state of the data memory block is stored in the protect data memory region.

According to one embodiment of the present invention, in response to the erase state confirmation signal and the address transition detecting signal, the reading element reads the erase complete data of the erase complete data memory region while reading the block protection data of the protection data memory region, where the erase state confirmation signal is predetermined, and the address transition signal is formed according to a transition of an address for accessing each of the non-volatile memory cells of the data memory block.

According to one embodiment of the present invention, the non-volatile semiconductor memory device further includes a protect data memory region including a plurality of non-volatile memory cells on which erase operation is performed separately from the non-volatile memory cells of the data memory block and the non-volatile memory cells of the erase complete data memory region, wherein block protection data indicating a protection state of the data memory block is stored in the protection data memory region.

According to one embodiment of the present invention, the reading element reads the erase complete data of the erase complete data memory region in response to the erase state confirmation signal and the address transition detecting signal while reading the block protection data of the protection data memory region, where the erase state confirmation signal is predetermined, and the address transition signal is formed according to a transition of an address for accessing each of the non-volatile memory cells of the data memory block.

According to one embodiment of the present invention, the non-volatile semiconductor memory device further includes a redundant element for replacing one of bit lines used for reading data in the non-volatile memory cells of the data memory block with a redundant bit line. Each of the bit lines of the data memory block and each of bit lines used for reading data in the non-volatile memory cells of the erase complete data memory region are mutually used. Whenever the bit line of the data memory block is replaced with the redundant bit line, the bit line of the erase complete data memory region which is mutually used with the bit line of the data memory block is also replaced with the redundant bit line.

According to one embodiment of the present invention, when reading data in the non-volatile memory cells of the erase complete data memory region, the bit line of the erase complete data memory region replaced with the redundant bit line is blocked.

According to one embodiment of the present invention, when reading data in the non-volatile memory cells of the erase complete data memory region where the bit line of the erase complete data memory region is replaced with the redundant bit line, a bit from the redundant bit line is ignored, and whether or not data in the non-volatile memory cells of the data memory block is successfully erased is determined based only on bits read from other bit lines of the erase complete data memory region.

According to one embodiment of the present invention, an erase complete data which is to be written into the erase complete data memory region may include at least each one of logic values "0" and "1". In this case, whether or not the data in the non-volatile memory cells of the erase complete data memory region has been successfully erased can be determined by determining whether or not at least each one of the logic values "0" and "1" are contained in the erase complete data read out from the erase complete data memory region.

According to one embodiment of the present invention, the reading element may read the erase complete data of the erase complete data memory region in response to an erase state confirmation signal and an address transition detecting signal.

According to one embodiment of the present invention, each of signal lines used for erasing data in the non-volatile memory cells of the erase complete data memory region and each of signal lines used for erasing data in the non-volatile memory cells of the data memory block may be used mutually. In this case, data in each non-volatile memory cell of the data memory block and data in each non-volatile memory cell of the erase complete data memory region can be erased for certain.

According to one embodiment of the present invention, when the erase complete data read from the erase complete data memory region by the reading element is the same as the erase complete data written into the erase complete data memory region by the writing element, it may be determined that erasing data in the non-volatile memory cells of the data memory block has been successfully completed. In this case, since the erase complete data read from the erase complete data memory region and the erase complete data which is to be written are compared, more accurate determination can be done than determining based on whether or not at least each one of the logic values "0" and "1" are contained in the erase complete data.

According to one embodiment of the present invention, the determining element may output a result indicating that erasure of data in each non-volatile memory cell of the data memory block has been successfully completed or has been a failure.

According to one embodiment of the present invention, a protection data memory region may be provided in to which block protection data indicating a protection state of the data memory block is stored, so as to simultaneously read out the erase complete data and the block protection data. By doing so, a simple and high-speed process is realized. The block protection data inhibits erase and write operations of, for example, data in the data memory block.

According to one embodiment of the present invention, in response to the erase state confirmation signal and the address transition detecting signal, the reading element may read the erase complete data of the erase complete data memory region while reading the block protection data of the protection data memory region. By doing so, a simple and high-speed process is realized.

According to one embodiment of the present invention, each of the bit lines used for reading data in the memory cells of the data memory block and each of bit lines used for reading data in the non-volatile memory cells of the erase complete data memory region may be mutually used, so that whenever the bit line of the data memory block is replaced with the redundant bit line, the bit line of the erase complete data memory region which is mutually used with the bit line of the data memory block is also replaced with the redundant bit line. By doing so, the structure of the non-volatile semiconductor memory device may be simplified.

According to one embodiment of the present invention, when reading data in the non-volatile memory cells of the erase complete data memory region, the bit line of the erase complete data memory region replaced with the redundant bit line may be blocked. Alternatively, when reading data in the non-volatile memory cells of the erase complete data memory region, where the bit line of the erase complete data memory region is replaced with the redundant bit line, whether or not data in the non-volatile memory cells of the data memory block is successfully erased is determined based only on bits read from other bit lines of the erase complete data memory region.

In this case, the bit line is not replaced with the redundant bit line when reading data in the non-volatile memory cells of the erase complete data memory region, part of the erase complete data can be fetched for certain from the erase complete data memory region.

Thus, the invention described herein makes possible the advantages of (1) providing a non-volatile semiconductor memory device in which determination of whether or not an erase operation has been successful is ensured even when the erase operation is forcibly terminated due to, for example, the cut-off of a power source or a reset of a device; and (2) providing a device which is easily applicable and does not complicate programming of a system incorporating the memory device.

These and other advantages of the present invention will become apparent to those skilled in the art upon reading and understanding the following detailed description with reference to the accompanying figures.

DESCRIPTION OF THE PREFERRED EMBODIMENTS

Figure 1:
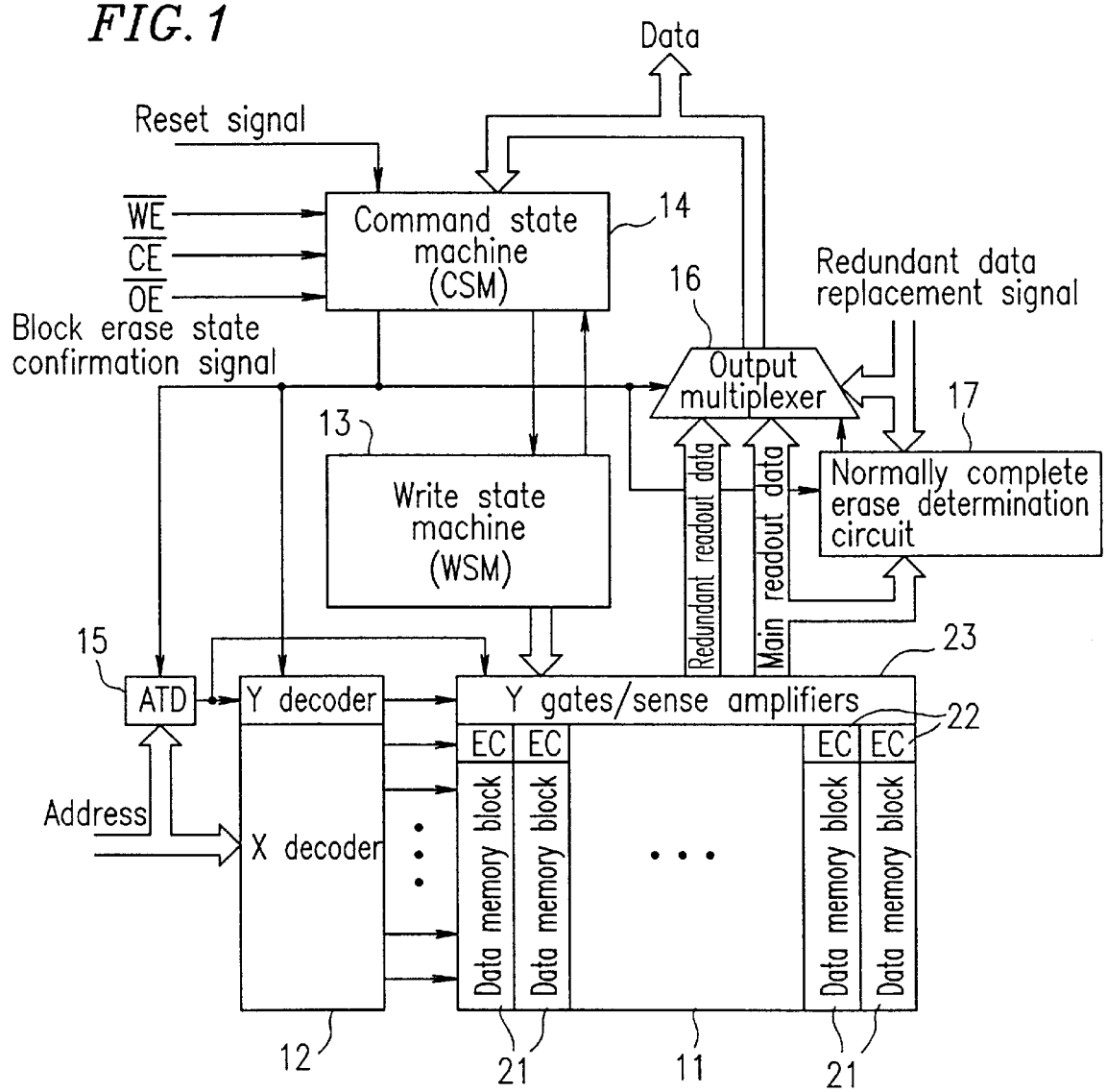
FIG. 1 is a block diagram showing a non-volatile semiconductor memory device according to the present invention.

Hereinafter, the present invention will be described by way of illustrative examples with reference to the accompanying drawings. The same reference numerals designate the same components.

EXAMPLE 1

FIG. 1 is a block diagram showing a non-volatile semiconductor memory device according to a first example of the present invention. The memory device according to the first example is a flash memory which includes a memory cell array 11, a decoder 12 into which an address is externally input and by which the input address is decoded and output to the memory cell array 11, a write state machine 13 which is responsible for erasing data from and writing data into the memory cell array 11, a command state machine 14 for determining a type of a command based on each externally input control signal and address, an ATD address transition detecting circuit 15 for detecting a transition state and the like of an externally input address so as to generate a timing pulse, a multiplexer 16 into which data and redundant data from the memory cell array 11 are input and which switches and then outputs the data and the redundant data, and a normally complete erase operation determination circuit 17 into which an erase complete data from the memory cell array 11 is input so as to be compared with a predetermined erase complete data.

The memory cell array 11 includes N data memory blocks 21, with an erase complete (EC) data memory region 22 provided for each of the data memory blocks 21. In addition, the memory cell array 11 includes a corresponding group of gates and sense amplifiers 23. Each data memory block 21 of the memory cell array 11 includes memory cells which are accessed so as to write data thereto and to read out data therefrom in accordance with a column address and a row address input from the decoder 12.

The size (e.g., number of bits) of the data memory blocks 21 of the memory cell array 11 may be the same (a uniform block type) or may be different from each other (e.g., a boot block type). Each data memory block 21 may also be referred to as a "sector" in a flash memory incorporated in a HDD (Hard Disc Drive) compatible system.

Figure 2:
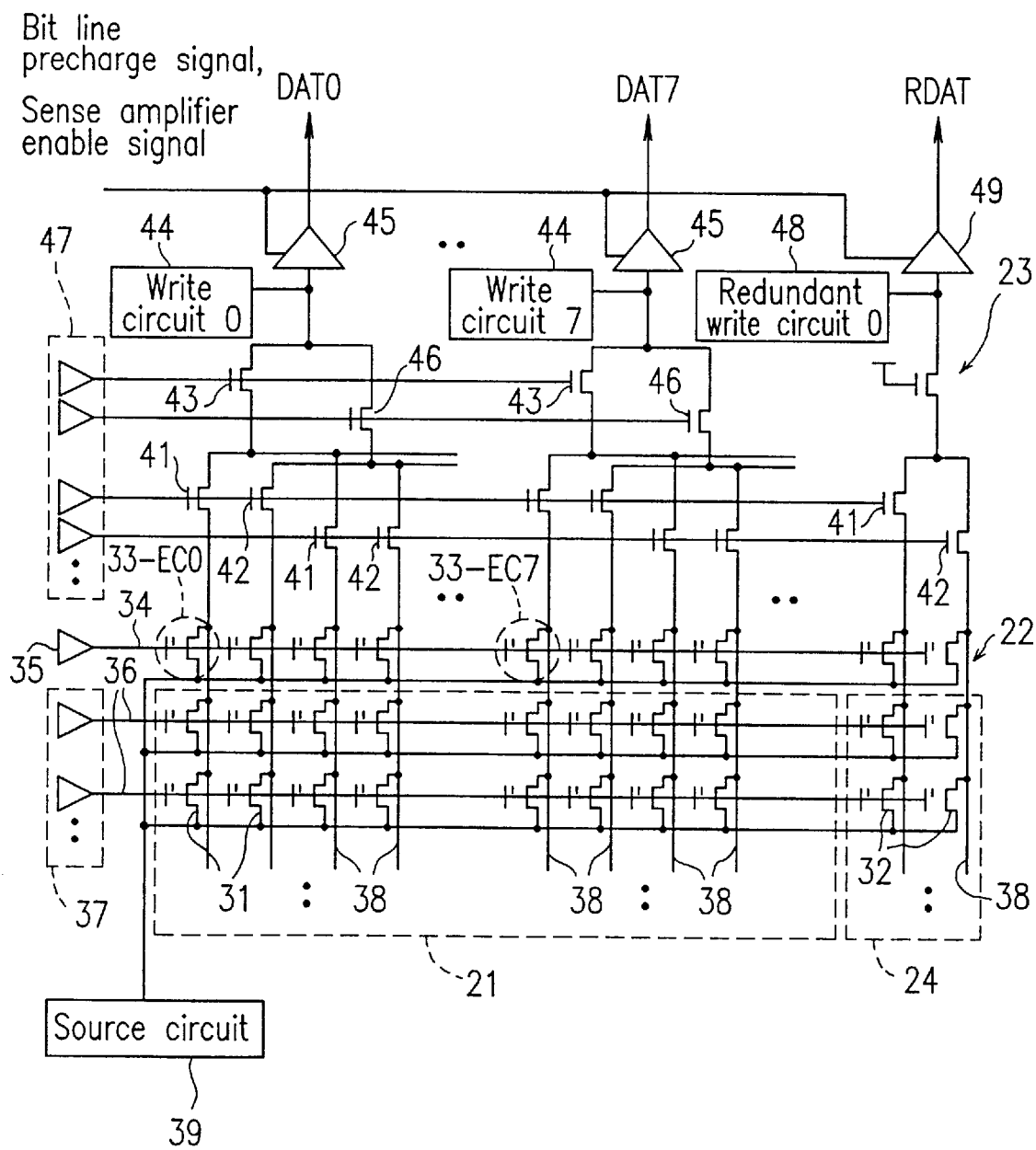
FIG. 2 is a circuit diagram showing in detail one of the data memory blocks of the memory cell according to a first example of the present invention.

FIG. 2 is a circuit diagram showing in detail one of the data memory blocks 21 of the memory cell 11. Also shown in FIG. 2 are one of the erase complete data memory regions 22, one of the group of gates and sense amplifiers 23, a redundant circuit 24 and the like, corresponding to the data memory block 21.

As shown in FIG. 2, the data memory block 21 includes a plurality of cell transistors 31 arranged in a matrix. The redundant circuit 24 includes 2 columns of cell transistors 32, and the erase complete data memory region 22 includes a row of cell transistors 33.

Figure 9:
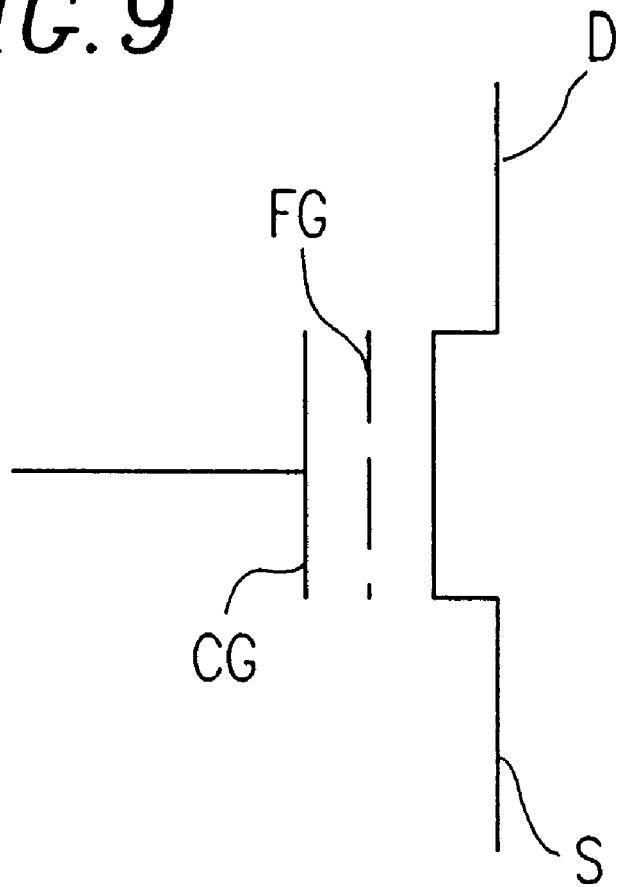
FIG. 9 is a schematic diagram showing the structure of a floating-gate-type FET transistor of a conventional flash memory.
Figure 10:
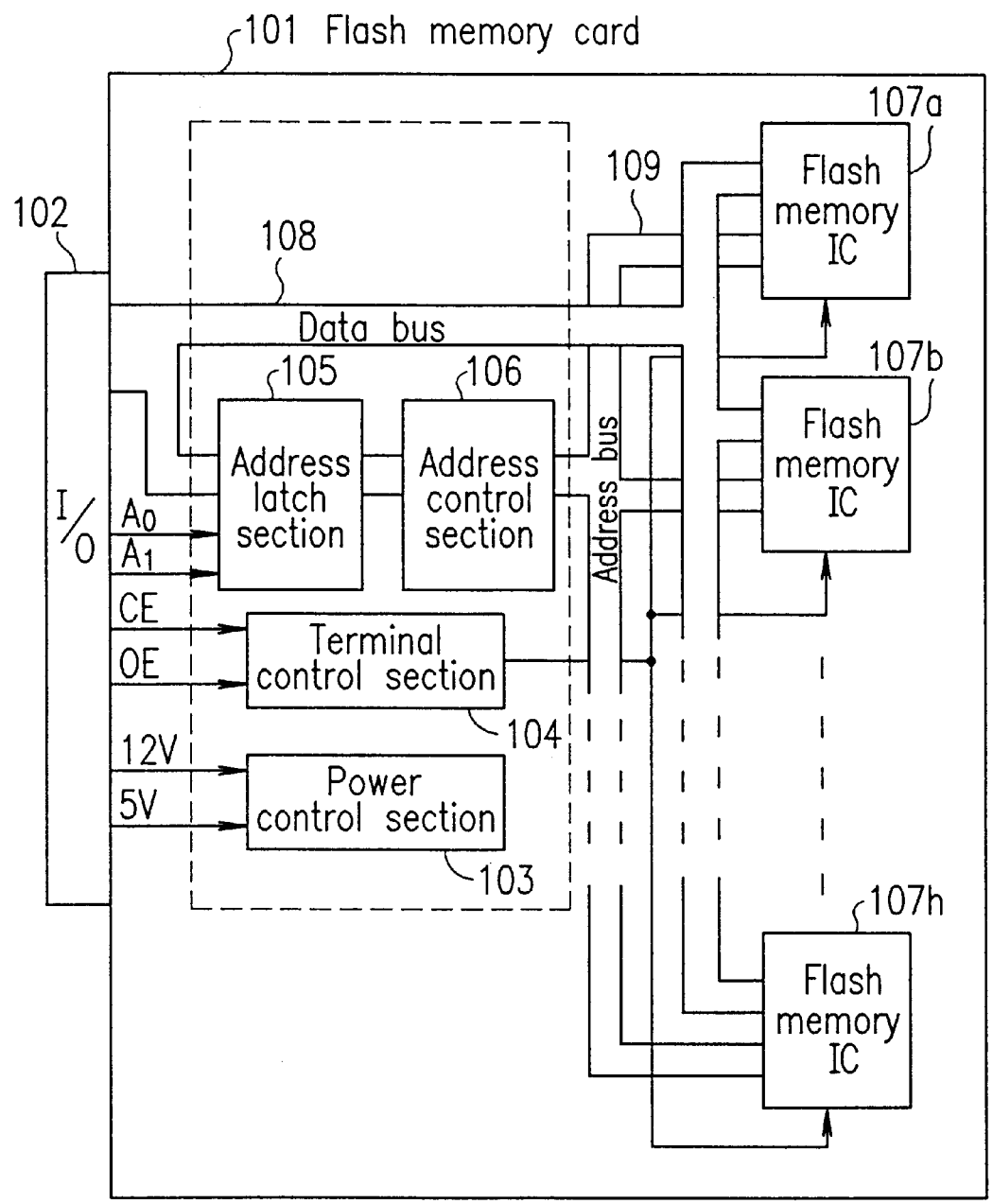
FIG. 10 is a block diagram showing a conventional flash memory.

The structure of each of the above-mentioned cell transistors is substantially the same as that shown in FIG. 9. Specifically, each cell transistor has a floating-gate-type FET structure in which a control gate CG is provided on a gate oxide film, with a floating gate FG being provided in the gate oxide film.

Gates of all cell transistors 33 of the erase complete data memory region 22 are commonly connected to an EC word line 34. An EC driver 35 turns on each cell transistor 33 of the erase complete data memory region 22 via the EC word line 34 in accordance with a row address.

The cell transistors 31 of the data memory block 21 and the cell transistors 32 of the redundant circuit 24 are grouped into rows as shown in FIG. 2. The gates of the cell transistors in each row are commonly connected to a main word line 36. The main word line driver 37 sequentially selects each main word line 36 in accordance with a row address, so as to turn on the cell transistors 31 and the cell transistors 32 via the selected main word line 36.

Furthermore, all of the cell transistors 31, 32 and 33 are also grouped into columns as shown in FIG. 2. The drains of the cell transistors in each column are commonly connected to a bit line 38. The sources of all of the cell transistors 31, 32 and 33 are commonly connected to a source circuit 39.

The bit lines 38 are grouped into pairs. A voltage representing one data is complementary applied to each pair of bit lines 38. Each pair of bit lines 38 is connected to two select transistors 41 and 42. Each of the select transistors 41 is connected to a write circuit 44 and a sense amplifier 45 via a transistor 43 while each of the select transistors 42 is connected to the write circuit 44 and the sense amplifier 45 via a transistor 46.

A row selecting driver 47 selectively turns on each of the select transistors 41, 42, 43 and 46 in accordance with a row address, so as to select eight pairs of bit lines 38 as one unit and connect at least eight pairs of selected bit lines 38 to corresponding write circuits 44 and sense amplifiers 45.

The bit lines 38 of the data memory block 21 are identified according to column addresses. For each column address, eight pairs of bit lines 38 representing data for 1 word (8 bits) are selected.

One column address corresponds to one of cell transistors 33-EC0 to 33-EC7 of erase complete data memory region 22 in which erase complete data is stored. In cell transistors 33 other than the cell transistors 33-EC0 to 33-EC7 of the erase complete data memory region 22, data such as protect data may be stored.

In order to read out data, the main word line driver 37 selectively turns on the cell transistors 31 via one of the main word lines 36 while the column selecting driver 47 selects and connects eight pairs of bit lines 38 to the corresponding write circuits 44 and sense amplifiers 45. The sources of the selected cell transistors 31 are grounded by the source circuit 39 while a potential of each pair of bit lines 38 is set low by each sense amplifier 45. As a result, a signal voltage from each cell transistor is provided to each bit line 38, and eventually, a value of data of each pair of bit lines 38 is fetched via the corresponding sense amplifier 45.

In the case where one of the eight pairs of the bit lines 38 is replaced with a pair of bit lines 38 of a redundant circuit 24, a low potential is provided to the bit lines 38 of the redundant circuit 24 by a redundant sense amplifier 49, and a value of data thereof is fetched via the redundant sense amplifier 49.

In order to erase data, all cell transistors are turned on via the main word lines 36 and the sources of the cell transistors are grounded by the source circuit 39. A predetermined voltage is provided from the write circuits 44 to cell transistors via bit lines 38 so as to pre-write the cell transistors. A negative voltage is applied to the gates of the cell transistors via the main word lines 36 while a potential of the sources of the cell transistor are set equal to the supply voltage by the source circuit 39, thereby collectively erasing data of all of the cell transistors.

In order to write data, the cell transistors 31 are turned on via one of the main word lines 36 while eight pairs of bit lines 38 are selected by the column selecting driver 47. The sources of the cell transistors are grounded by the source circuit 39 while a predetermined voltage from the write circuits 44 is selectively provided to the cell transistors via the pair of bit lines 38, thereby storing data in these cell transistors.

In the case where one of the eight pairs of the bit lines 38 is replaced with a pair of bit lines 38 of the redundant circuit 24, a predetermined voltage is provided from the redundant write circuit 48 to the cell transistors 32 via the bit lines 38 of the redundant circuit 24, thereby storing data in these cell transistors 32.

The cell transistors 33 of the erase complete data memory region 22 function in the same manner as the cell transistors 31 of the data memory block 21. Specifically, each cell transistor 33 is turned on via the EC word line 34 while the column selecting driver 47 selects and connects eight pairs of bit lines 38 to the corresponding write circuits 44 and the corresponding sense amplifiers 45, thereby performing read and write operations. Moreover, data in the cell transistors 33 is erased with data in other cell transistors in a previously described manner.

The redundant circuit 24 is used only when there is a defect relating to the pairs of bit lines 38 of the data memory block 21. In operation, the bit lines 38 of the redundant circuit 24 are used, instead of bit lines 38 associated with defect, by selecting a column address of the redundant circuit 24.

Returning to FIG. 1, the decoder 12 decodes an externally input address to a column address and a row address. The row address selects one of the word lines of the memory cell array 11. The column address selects eight pairs of bit lines 38 (FIG. 2) of the memory cell array 11.

The write state machine 13 shown in FIG. 1 operates in response to a command from the command state machine 14, thereby writing data into each memory cell, i.e., cell transistor, of the data memory block 21 of the memory cell array 11 or collectively erasing data in the memory cells of the data memory block 21 for each memory block.

The command state machine 14 shown in FIG. 1 is a circuit for determining the type of command based on externally input control signals such as a chip enable signal /CE, a write enable signal /WE and an output enable signal /OE, as well as externally input data and an address.

For example, an active (low) chip enable signal nal /CE indicates that the flash memory is to be accessed, an active (low) write enable signal /WE indicates that a write access is to be performed and an active (low) output enable signal /OE indicates that a read access is to be performed.

During one to several bus cycles, the command state machine 14 determines the type of the access indicated by the control signal and determines the type of the command by detecting the value of the data, or by detecting whether or not the value of the address matches a predetermined value, thereby sending the command to the write state machine 13. Such commands include, for example a command for writing data, a command for collectively erasing data in the memory cells of the data memory blocks 21 and a command for confirming whether or not the collective erasure has succeeded. Upon receiving the command for confirming whether or not the collective erasure has been successful, the command state machine 14 sets the block erase state confirmation signal high.

An external reset signal is input to the command state machine 14 upon turning on the power or resetting the system. In response to this reset signal, the command state machine 14 is initialized.

Figure 3:
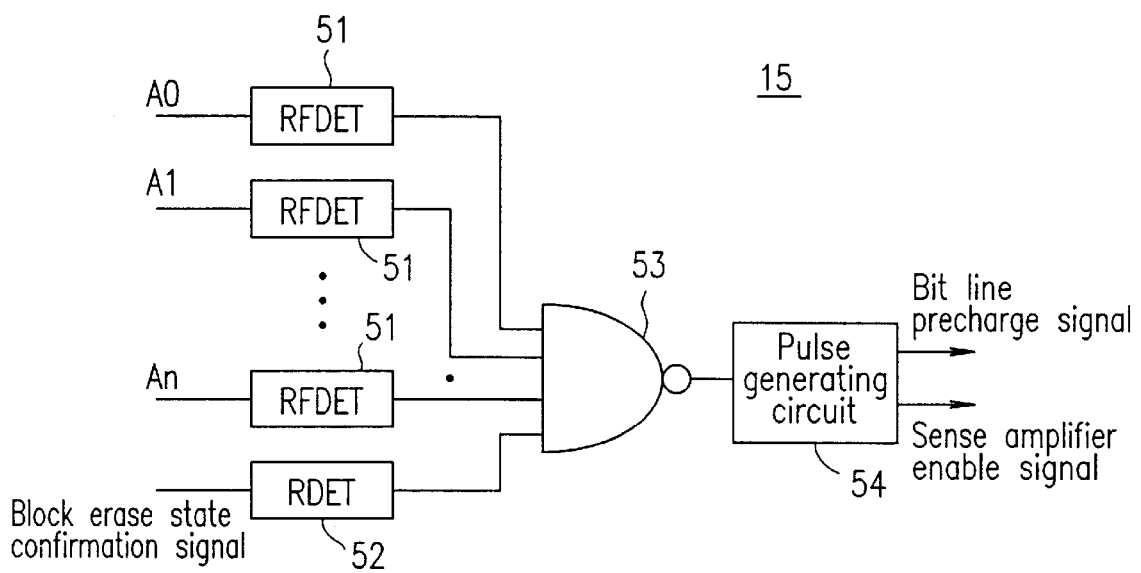
FIG. 3 is a diagram showing a detailed structure of an ATD address transition detecting circuit shown in FIG. 1 according to the first example of the present invention.

FIG. 3 is a diagram showing a detailed structure of the ATD address transition detecting circuit 15 shown in FIG. 1.

Referring to FIG. 3, each external address signal A0, A1, ... An is input to each rise/fall detecting circuit (RFDET) 51, whereby the rise/fall detecting circuit 51 detects rise and fall of each address signal. Each time the detecting circuit 51 detects a rise and fall of the address signals, a pulse signal is provided to a NAND circuit 53. At the same time, a block erase state confirmation signal from the command state machine 14 (FIG. 1) is input to a rise detecting circuit 52, whereby the rise detecting circuit 52 detects a rise of the block erase state confirmation signal. Each time the rise detecting circuit 52 detects a rise of the block erase state confirmation signal, a pulse signal is provided to a NAND circuit 53. The NAND circuit 53 NANDS together the pulse signals from the rise/fall detecting circuits 51 and the rise detecting circuit 52, and supplies the result to the pulse generating circuit 54. Upon receiving a pulse signal from the NAND circuit 53, the pulse generating circuit 54 generates and outputs a timing pulse for controlling the sense amplifiers 45 of the memory cell array 11, the decoder 12 and the like. Such timing pulses are, for example, a bit line precharge signal or a sense amplifier enable signal for the sense amplifiers 45 of the memory cell array 11. Each sense amplifier 45 pre-charges the bit lines prior to reading and writing data in response to the bit line pre-charge signal, and amplifies and outputs the signal voltage on the bit lines in response to the sense amplifier enable signal.

The ATD address transition detecting circuit 15 may include a circuit for detecting an external chip enable signal /CE and a circuit for detecting a read array signal generated by the command state machine 14 (FIG. 1) in response to an external read array command (i.e., a command for tripping to a read mode).

Figure 4:
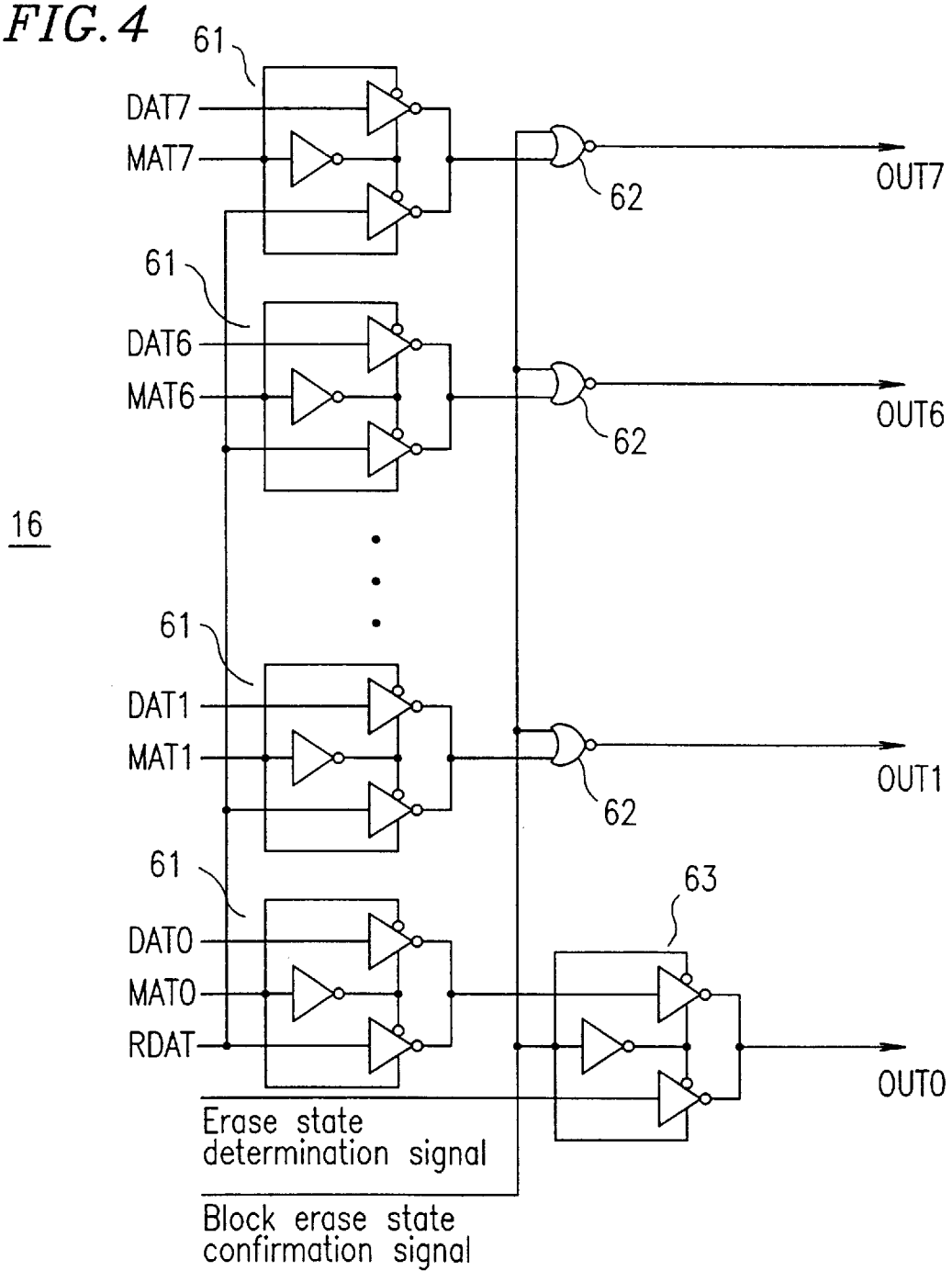
FIG. 4 is a diagram showing a detailed structure of the multiplexer shown in FIG. 1.

FIG. 4 is a diagram showing a detailed structure of the multiplexer 16 shown in FIG. 1.

Each gate circuit 61 corresponds to each sense amplifier 45 (FIG. 2) of the memory cell array 11 (FIG. 1) which outputs 1 word (8 bits). As shown in FIG. 4, data signals DAT0, DAT1, ... DAT7 are input from the sense amplifiers 45 to the gate circuits 61. A redundant data signal RDAT from the redundant sense amplifier 49 (FIG. 2) of the redundant circuit 24 (FIG. 2) and redundant data replacement signals MAT0, MAT1, ... MAT7 are also input into the gate circuits 61.

When there is no defect relating to the pairs of bit lines 38 of the data memory block 21, the gate circuits 61 select and output the data signals DAT0, DAT1, ... DAT7 from the sense amplifier 45. The data signals DAT1, ... DAT7 are sent via NOR circuits 62, and the data signal DAT0 is sent via a gate circuit 63.

When there is a defect relating to one of the pairs of bit lines 38 of the data memory block 21, one of the redundant data replacement signals MAT0, MAT1, ... MAT7 corresponding to the defective pair of bit lines 38 is set high, whereby the high redundant data replacement signal is added to one of the gate circuits 61. This gate circuit 61 outputs a redundant data signal RDAT instead of the data signal from the sense amplifier 45.

In the case of writing or reading data in the cell transistors of the data memory block 21, whether or not collective erasure of the cell transistors has been successful is not confirmed. While each signal from each gate circuit 61 is sent via the NOR circuit 62 or the gate circuit 63, the block erase state confirmation signal from the command state machine 14 is set low.

When whether or not collective erasure of the cell transistors has been successful is to be confirmed, the block erase state confirmation signal from the command state machine 14 is set high.

In this case, the gate circuit 63 blocks the data signal DAT0 from the gate circuit 61, and instead, inverts and sends an erase state determination signal from the normally complete erase determination circuit 17 in place of the data signal DAT0. As will be described later, the collective erasure state determination signal is set high when collective erasure of data in the cell transistors of the data memory block 21 has been successful, and set low when unsuccessful. In other words, when the collective erasure has been successful, a low signal is sent from the gate circuit 63 and when the collective erasure is unsuccessful, a high signal is sent from the gate circuit 63.

When the block erase state confirmation signal from the command state machine 14 is high, the output of each NOR circuit 62 is fixed low.

As a result, when the collective erasure of data in the cell transistors of the data memory block 21 has been successful, an eight bit signal output from the multiplexer 16 is "00000000", and when unsuccessful, the eight bit signal output from the multiplexer 16 is "00000001".

Figure 5:
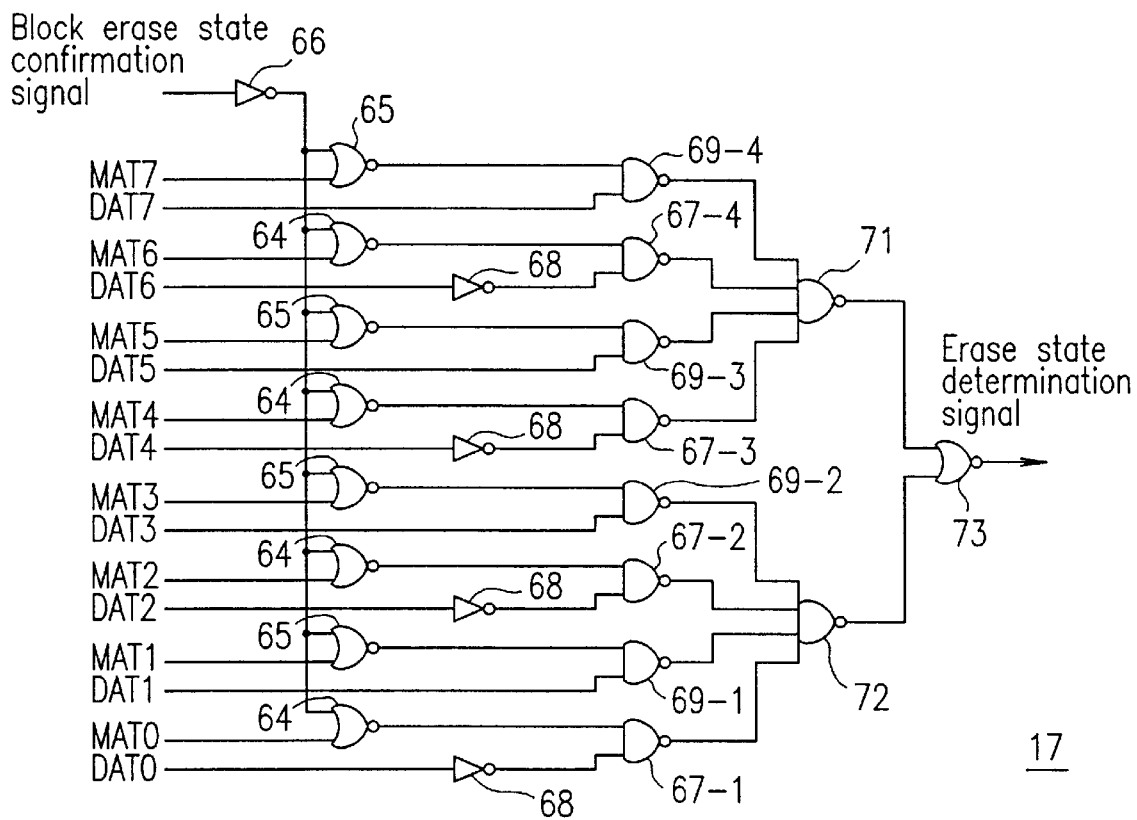
FIG. 5 is a circuit diagram showing a detailed structure of a normally complete erase determination circuit shown in FIG. 1.

FIG. 5 is a circuit diagram showing a detailed structure of the normally complete erase determination circuit 17 shown in FIG. 1.

Referring to FIG. 5, redundant data replacing signals MAT0, MAT1, ... MAT7 are input into the NOR circuits 64 and 65. Simultaneously with the redundant data replacing signals MAT0, MAT1, ... MAT7, a block erase state confirmation signal is also input into the NOR circuits 64 and 65 via an inverting circuit 66. Signals from the NOR circuits 64 are input into NAND circuits 67-1 to 67-4. Simultaneously, data signals DAT0, DAT2, DAT4 and DAT6 from the sense amplifiers 45 (FIG. 3) of the data memory block 21 (FIG. 2) are also input to the NAND circuits 67-1 to 67-4 via inverting circuits 68, whereby the NAND circuits 67-1 to 67-4 output signals indicating a NAND operation of their input signals. Similarly, signals from the NOR circuits 65 are input into NAND circuits 69-1 to 69-4. Simultaneously, data signals DAT1, DAT3, DAT5 and DAT7 from the sense amplifiers 45 (FIG. 3) of the data memory block 21 (FIG. 2) are input to the NAND circuits 69-1 to 69-4, whereby the NAND circuits 69-1 to 69-4 output signals indicating a NANDing of the input signals. Signals from the NAND circuits 67-3, 67-4, 69-3 and 69-4 are input to a NAND circuit 71, whereby the NAND circuit 71 outputs signal indicating a NAND operation of the input signals. Similarly, signals from the NAND circuits 67-1, 67-2, 69-1 and 69-2 are input to an NAND circuit 72, whereby the NAND circuit 72 outputs a signal indicating a NAND operation of the input signals. Furthermore, signals from the NAND circuits 71 and 72 are input into a NOR circuit 73, whereby the NOR circuit 73 outputs an erase state determination signal by NORing the respective inputs.

In the event whether or not collective erasure of each cell transistor of the date memory block 21 has succeeded is to be confirmed, a block erase state confirmation signal from the command state machine 14 is set high. Accordingly, outputs from the inverting circuit 66 are set low and added to each of the NOR circuits 64 and 65. When there is no defect relating to the pairs of bit lines 38 of the data memory block 21, all of the redundant data replacing signals MAT0, MAT1, . . . MAT7 are set low, and high signals are output from the NOR circuits 64 and 65.

As will be described later, when the collective erasure of data in the cell transistors of the data memory block 21 has been successful, erase complete data "01010101" is written into each cell transistor 33-ECO to 33-EC7 of the erase complete data memory region 22 (FIG. 2) of the data memory block 21 (FIG. 2) by the write state machine 13 (FIG. 1). When the block erase state confirmation signal from the command state machine 14 (FIG. 1) is set high, the erase complete data "01010101" of the erase complete data memory region 22 is input into the normally complete erase determination circuit 17 as data signals DAT0, . . . DAT7.

The high signals from the NOR circuits 64 are input to the NAND circuits 67-1 to 67-4. Simultaneously, data signals DAT0, DAT2, DAT4 and DAT6 ("1111") are input into the NAND circuits 67-1 to 67-4 via the inverting circuits 68, whereby the NAND circuits 67-1 to 67-4 output high signals indicating a NANDing, respectively. Similarly, high signals from the NOR circuits 65 are input in the NAND circuits 69-1 to 69-4. Simultaneously, data signals DAT1, DAT3, DAT5 and DAT7 ("0000") are input into the NAND circuits 69-1 to 69-4, whereby the NAND circuits 69-1 to 69-4 output high signals indicating a NANDing, respectively. In response to the high signals output from the NAND circuits 67-1 to 67-4, and 69-1 to 69-4, an high erase state determination signal is output from the NOR circuit 73.

When collective erasure of data in the cell transistors of the data memory block 21 has not been successful, erase complete data is not written into the cell transistors 33-ECO to 33-EC7 of the erase complete data memory region 22 of the data memory block 21. Instead, data other than the erase complete data "01010101" (e.g., "00000000" or "11111111") is written into these cell transistors, whereby such error data is input into the normally complete erase determination circuit 17 as data signals DAT0, . . . DAT7.

In this case, since a low signal is output from at least one of the NAND circuits 67-1 to 67-4, and 69-1 to 69-4, a low erase state determination signal is output from the NOR circuit 73.

When the block erase state confirmation signal for confirming whether or not the collective erasure has been successful is high, in the case where an erase complete data "01010101" indicating that collective erasure has been successful is written into the cell transistors 33-ECO to 33-EC7, the erase state determination signal from the normally complete erase determination circuit 17 is set high. On the other hand, in the case where the collective erasure has not been successful and the erase complete data "01010101" is not written, the erase state determination signal from the normally complete erase determination circuit 17 is set low.

In the case where there is a defect relating to one of the pairs of the bit lines 38 of the data memory block 21, any one of the redundant data replacement signals MAT0, MAT1, . . . MAT7 is set high. In this case, a low signal is output from one of the NOR circuits 64 and 65 to one of the NAND circuits 67-1 to 67-4 and 69-1 to 69-4 which then outputs a signal fixed high. Therefore, when data signals of correct erase complete data are input to other NAND circuits, high signals are output from all of the NAND circuits 67-1 to 67-4, and 69-1 to 69-4. In response to this, the erase state determination signal from the normally complete erase determination circuit 17 is set high.

For example, when the redundant data replacing signal MAT0 is set high, regardless of the data signal DAT0 of the erase complete data being high or low, the output from the NAND circuit 67-1 is set high. When data signals DAT1, . . . DAT7 of correct erase complete data are input to other NAND circuits 67-2 to 67-4 and 69-1 to 69-4, the erase state determination signal is set high.

In the case where there is a defect relating to one of the pairs of bit lines 38 of the data memory block 21 and there is a possibility of one of the data signals DAT0, . . . DAT7 being an error, one of the redundant data replacement signals MAT0, MAT1, . . . MAT7 is set high. By doing so, an output of one of the NAND circuits 67-1 to 67-4 and 69-1 to 69-4 which is input with an error data signal fixed high. As a result, the error data signal is ignored, and a level of the erase state determination signal is determined based only on data signals other than the error data signal, thereby confirming whether or not the collective erasure has been successful. Thus, even when there is a defect relating to any one of the pairs of bit lines 38 of the data memory block 21, whether or not collective erasure has been successful can be confirmed.

In writing and reading data in the cell transistors of the data memory block 21, where whether or not collective erasure of the cell transistors has been successful is not confirmed, the block erase state confirmation signal is set low. Accordingly, the NOR circuits 64 and 65 (FIG. 5) and the like are in a disable state, whereby switching noise generated in response to signal transition of data signals and the like from the sense amplifiers is suppressed, and consumed current can be reduced.

Figure 6:
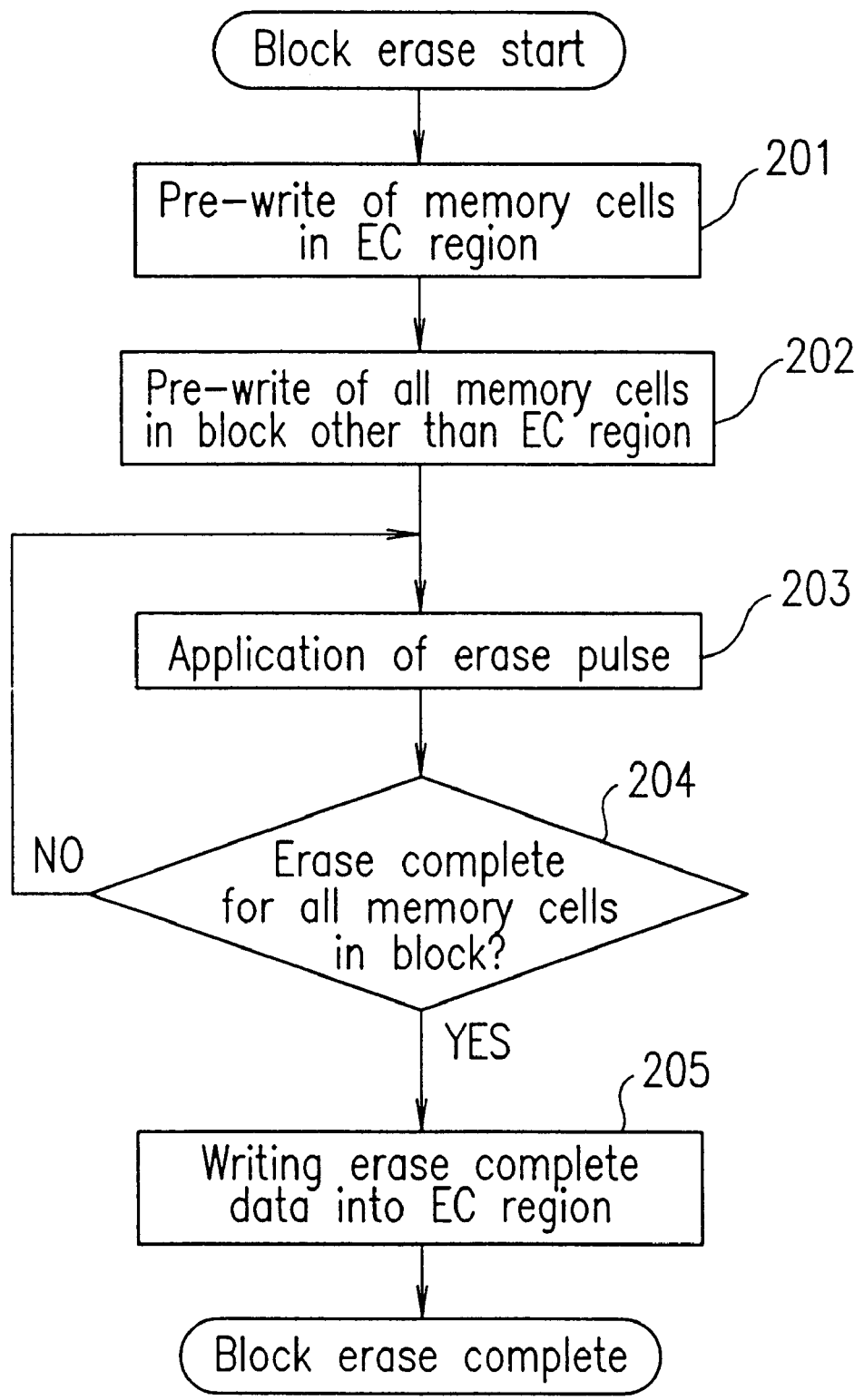
FIG. 6 is a flow diagram showing a process of collectively erasing the cell transistors of the data memory block.

FIG. 6 is a flow diagram showing a process of collectively erasing the cell transistors of the data memory block 21 and writing the erase complete data "01010101" into the cell transistors 33-ECO to 33-EC7 of the erase complete data memory region 22 of the data memory block 21.

First, an external command requesting collective erasure of the cell transistors of the data memory block 21 is input to the command state machine 14. The command state machine 14 recognizes the command and requests collective erasure to the write state machine 13. In response to this request, the write state machine 13 performs pre-writing on the cell transistors of the erase complete data memory region 22 (Step 201). As a result, data "00000000" is stored in the cell transistors 33-ECO to 33-EC7 of the erase complete data memory region 22. Similarly, the write state machine 13 performs pre-writes on the cell transistors of the data memory block 21 (Step 202).

Then, the write state machine 13 erases data in the cell transistors of the erase complete data region 22 and those in the data memory block 21. The erase is performed by applying a negative voltage to the gates of all of the cell transistors via the word lines while setting potentials of the sources of all of the cell transistors to a supply voltage by the source circuit 39.

The source circuit 39 provides potentials to the sources of the cell transistor in a pulselike manner (hereinafter, referred to as "an erase pulse"), removes signal charge from the floating gates of the cell transistors, thereby decreasing the threshold values of the cell transistors (Step 203). Then, the write state machine 13 determines whether or not the threshold values of the cell transistors of the erase complete data memory region 22 and those of the data memory block 21 have become equal to or lower than a predetermined value (Step 204).

Depending on a production process, layout or the like, the amounts by which the thresholds of the cell transistors are reduced by an erase pulse are not uniform. Therefore, threshold values of the cell transistors vary. In order to minimize this variation, short erase pulses may successively be applied to the cell transistors until the threshold values of the cell transistors become equal to or lower than the predetermined value. For this reason, Steps 203 and 204 are repeated.

The above-described Steps 203 and 204 are repeated until the write state machine 13 determines that the threshold values of the cell transistors of the erase complete data memory region 22 and those of the data memory block 21 have become equal to or lower than the predetermined value (Step 204, Yes). At this point, data "11111111" is stored in the cell transistors 33-ECO to 33-EC7 of the erase complete data memory region 22.

Lastly, the write state machine 13 writes erase complete data "01010101" into the cell transistors 33-ECO to 33-EC7 of the erase complete data memory region 22 (Step 205).

After erasing data in the cell transistors of the erase complete data memory region 22 and those of the data memory block 21 and writing the erase complete data "01010101" into the cell transistors 33-ECO to 33-EC7 of the erase complete data memory region 22 as described above, erase complete data is read out from the erase complete data memory region 22 as follows.

First, an external command requesting confirmation of whether or not the collective erasure has succeeded is input to the command state machine 14. The command state machine 14 recognizes the command and sets a block erase state confirmation signal high. The high block erase state confirmation signal is provided to the ATD address transition detecting circuit 15, the decoder 12, the normally complete erase determination circuit 17 and the multiplexer 16.

In response to the high block erase state confirmation signal, the ATD address transition detecting circuit 15 outputs a sense amplifier enable signal. In response to the transition of the address signal, the ATD address transition detecting circuit 15 also outputs a sense amplifier enable signal as described above.

In response to the high block erase state confirmation signal, the normally complete erase determination circuit 17 reads erase complete data from the cell transistors 33-ECO to 33-EC7 of the erase complete data memory region 22 so as to determine whether or not the erase complete data matches the predetermined data "01010101". When the erase complete data matches the predetermined data "01010101", a high erase state determination signal is output; if not, a low erase state determination signal is output.

When the erase state determination signal is low, the collective erasure is considered to have been interrupted, for example, due to the cut-off of the power source or a reset of the device during the course of the collective erasure.

In response to the high block erase state confirmation signal, the multiplexer 16 outputs either an eight bit signal "00000000" indicating that the collective erasure has been successful, or an eight bit signal "00000001" indicating that the collective erasure has been a failure.

In this manner, whether or not collective erasure of the data memory block 21 has been successful can be detected simply by externally inputting a command requesting a confirmation of whether or not the collective erasure has been successful. The command state machine 14 continues to output high block erase state confirmation signals until another command is input, power source is cut off or the device is reset. Thus, erase states of other data memory blocks may be rapidly detected by the ATD address transition detecting circuit 15 by simply selecting other data memory blocks by transiting the address.

EXAMPLE 2

Figure 7:
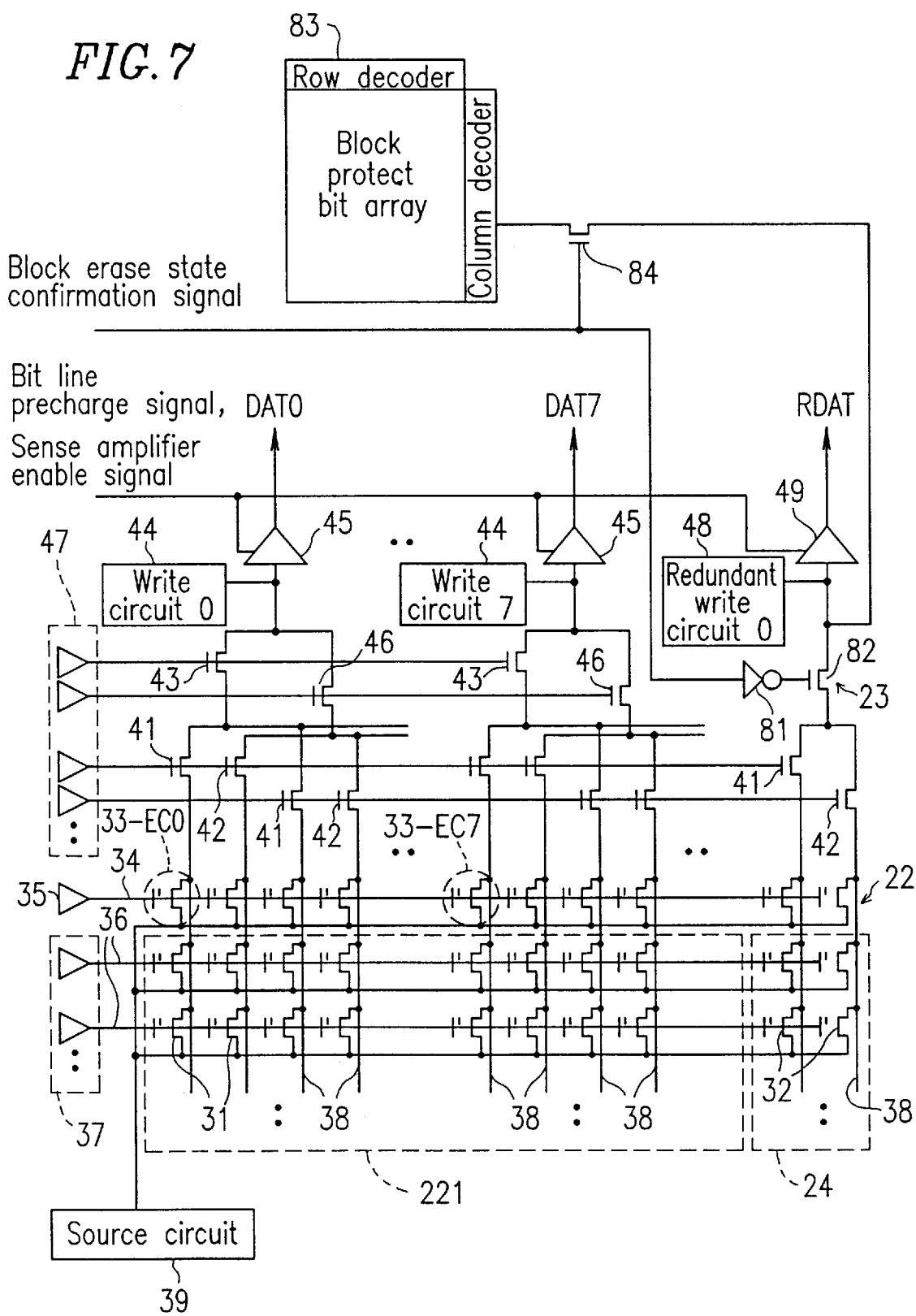
FIG. 7 is a detailed circuit diagram showing one of the data memory blocks of a non-volatile semiconductor memory device according to a second example of the present invention.

FIG. 7 is a detailed circuit diagram showing one of the data memory blocks 221 according to a second example of a memory cell array 11 of the present invention.

A structure of the non-volatile semiconductor memory device according to the second example of the present invention is generally identical to that of the non-volatile semiconductor memory device according to the first example of the present invention, except that a structure of the data memory block 221 is different from the data memory block 21 according to the first example.

In each data memory block 221 according to the second example of the present invention, a block erase state confirmation signal from a command state machine 14 (FIG. 1) is added to a select transistor 82 of a redundant circuit 24 via an inverting circuit 81. When the block erase state confirmation signal is low, that is, when data is written to or data is read from the data memory block 221, the select transistor 82 is turned on so that the redundant circuit 24 is connected to the redundant sense amplifier 49 so that the redundant circuit 24 is usable.

When the block erase state confirmation signal is high, that is, when whether or not collective erasure has been successful is to be confirmed, the select transistor 82 is turned off so that the redundant circuit 24 and the redundant sense amplifier 49 are disconnected.

In response to the high block erase state confirmation signal, a gate switch 84 of the data memory block 221 is opened, whereby a protect bit from a block protect bit array 83 is sent via the redundant sense amplifier 49 to a multiplexer.

Therefore, when the block erase state confirmation signal is high, erase complete data "01010101" is read out from cell transistors 33-ECO to 33-EC7 of the erase complete data memory region 22 while the protect bit is read out from the block protect bit array 83. Thus, simple and high-speed process can be performed.

The block protect bit array 83 is able to store protect bits corresponding to data memory blocks 221 of the memory cell 11 (FIG. 1). Thus, erase and write operations to the data memory blocks 221 are inhibited or allowed according to each protect bit.

The structure of the block protect bit array 83 is substantially the same as the structure of the data memory block 221. Specifically, the block protect bit array 83 includes cell transistors for storing protect bits.

Sources of the cell transistors of the block protect bit array 83 and sources of the cell transistors of the data memory block 221 are completely independent and are individually driven. According to this structure, even when the data in the cell transistors of the data memory block 221 is collectively erased, the protect bits in the cell transistors of the block protect bit array 83 corresponding to the data memory block 221 are not erased.

EXAMPLE 3

Figure 8:
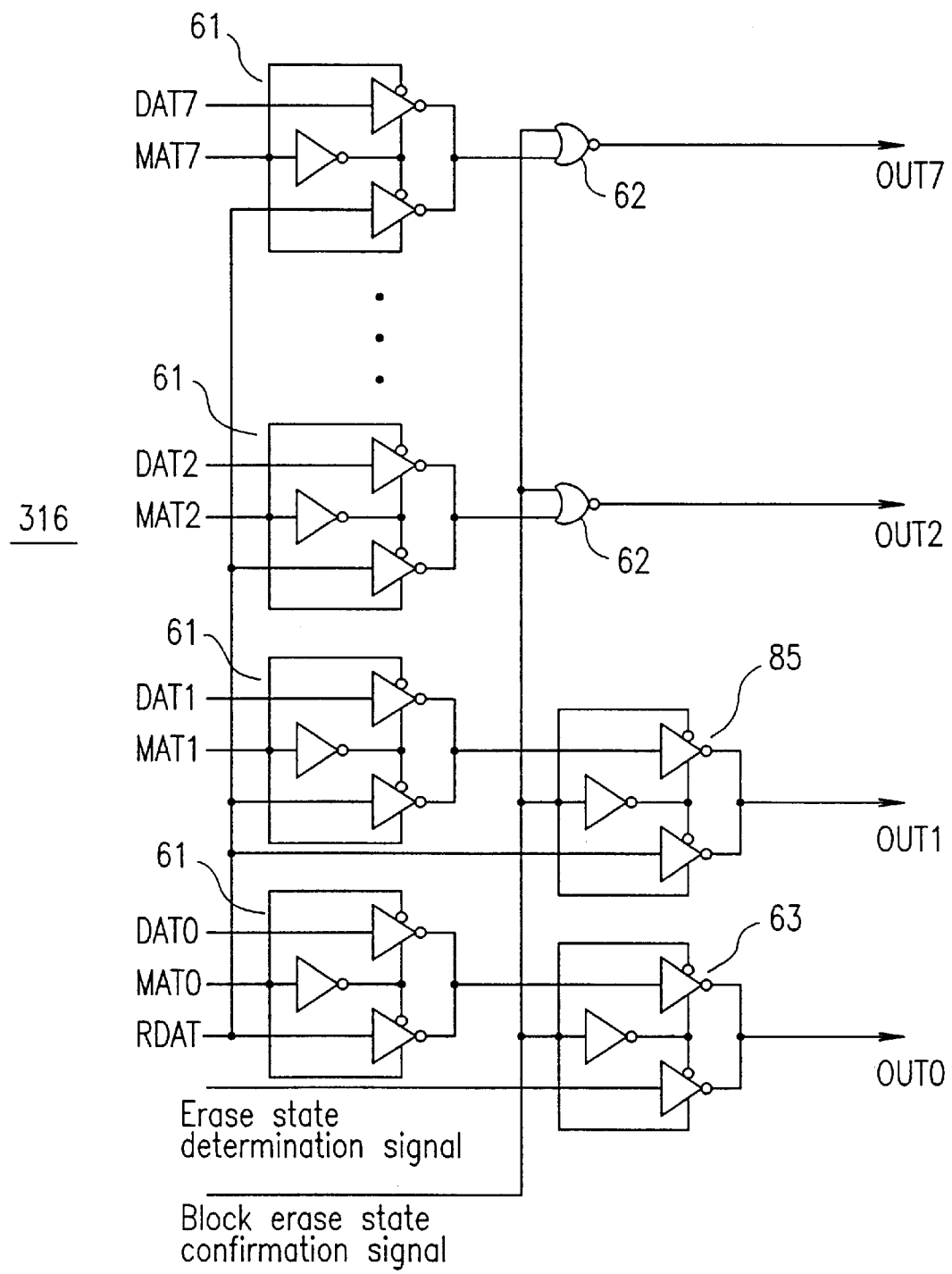
FIG. 8 is a circuit diagram showing in detail a structure of a multiplexer of a non-volatile semiconductor memory device according to a third example of the present invention.

FIG. 8 is a circuit diagram showing in detail a structure of a multiplexer 316 of a non-volatile semiconductor memory device according to a third example of the present invention.

The multiplexer 316 is substantially the same as the multiplexer 16 shown in FIG. 4 with the addition of a gate circuit 85. Moreover, the multiplexer 316 is configured so as to be applicable for the data memory block 221 according to the second example of the present invention shown in FIG. 7, where protect bits from the redundant sense amplifier 49 (FIG. 7) are input into the gate circuit 85.

Thus, referring to FIGS. 7 and 8, according to the third example of the present invention, when the block erase state confirmation signal is high, the select transistor 82 is turned off so that the redundant circuit 24 and the redundant sense amplifier 49 are disconnected and the gate switch 84 is opened, whereby a protect bit from the block protect bit array 83 is output via the redundant sense amplifier 49 to the gate circuit 85.

When the block erase state confirmation signal is high, the gate circuit 85 blocks a data signal DAT1 output from the gate circuit 61, and instead, inverts and outputs the protect bit from the redundant sense amplifier 49.

Erase and write operations to the data memory block 221 are inhibited when the protect bit in the block protect bit array 83 is in a write state (data "0"), and are allowed when the protect bit in the block protect bit array 83 is in an erase state (data "1"). Thus, when erase and write operations to the data memory block 21 are inhibited, a signal set high is output from the gate circuit 85 and when erase and write operations to the data memory block 21 are allowed, a signal set low is output from the gate circuit 85.

When the block erase state confirmation signal is high, by reading erase complete data "01010101" from the cell transistors 33-ECO to 33-EC7 of the erase complete data memory region 22 while reading the protect bit from the block protect bit array 83, two operations (i.e., confirmation of whether or not the collective erasure has been successful and confirmation of whether or not erase and write operations to the data memory block 21 are inhibited) can be simultaneously and thus quickly performed.

Thus, in a non-volatile semiconductor memory device of the present invention, data in non-volatile memory cells of an erase complete data memory region are erased together with data in non-volatile memory cells of a data memory block. Thereafter, erase complete data is written into the non-volatile memory cells of the erase complete data memory region. Accordingly, by reading the erase complete data from the erase complete data memory region, whether or not data in the non-volatile memory cells of the erase complete data memory region has been successfully erased can be determined based on the erase complete data. Since data in the non-volatile memory cells of the data memory block is erased when erasing data in the non-volatile memory cells of the erase complete data memory region, the above-described determination in the erase complete data memory region also applies to determination of whether or not data in the non-volatile memory cells of the data memory block has been successfully erased.

For example, when an erase operation is forcibly terminated due to shut down of power source or a reset of the device, whether or not the non-volatile memory cells of the data memory blocks has been successful can be determined based on the erase complete data in the erase complete data memory region.

Various other modifications will be apparent to and can be readily made by those skilled in the art without departing from the scope and spirit of this invention Accordingly, it is not intended that the scope of the claims appended hereto be limited to the description as set forth herein, but rather that the claims be broadly construed.

What is claimed is:

1. A non-volatile semiconductor memory device, comprising a data memory block having a plurality of non-volatile memory cells, in which data in the plurality of non-volatile memory cells of the data memory block is erased before writing data into the non-volatile memory cells of the data memory block, wherein the non-volatile semiconductor memory device further comprises:

an erase complete data memory region having a plurality of non-volatile memory cells which are subjected to erasure simultaneously with the plurality of non-volatile memory cells of the data memory block;

a writing element for writing erase complete data including a plurality of bits into the erase complete data memory region, after erasing data in the non-volatile memory cells of the data memory block and data in the non-volatile memory cells of the erase complete data memory region; and a reading element for reading the erase complete data in the erase complete data memory region.

2. A non-volatile semiconductor memory device according to claim 1, wherein the erase complete data including the plurality of bits comprises at least each one of logic values "0" and "1".

3. A non-volatile semiconductor memory device according to claim 1, wherein the reading element reads the erase complete data of the erase complete data memory region in response to an erase state confirmation signal and an address transition detecting signal, where the erase state confirmation signal is predetermined, and the address transition detecting signal is formed according to a transition of an address for accessing each of the non-volatile memory cells of the data memory block.

4. A non-volatile semiconductor memory device according to claim 1, wherein each of signal lines used for erasing data in the non-volatile memory cells of the erase complete data memory region and each of signal lines used for erasing data in the non-volatile memory cells of the data memory block are used mutually.

5. A non-volatile semiconductor memory device according to claim 1, further comprising a determining element which, when the erase complete data read from the erase complete data memory region by the reading element is the same as the erase complete data written into the erase complete data memory region by the writing element, determines that erasing data in the non-volatile memory cells of the data memory block has been successfully completed, and, when the erase complete data read from the erase complete data memory region by the reading element is not the same as the erase complete data written into the erase complete data memory region by the writing element, determines that erasing data in the non-volatile memory cells of the data memory block has been a failure.

6. A non-volatile semiconductor memory device according to claim 5, wherein the determining element outputs a result indicating that erasure of data in each non-volatile memory cell of the data memory block has been successfully completed or has been a failure, in response to an erase state confirmation signal and an address transition detecting signal, where the erase state confirmation signal is predetermined, and the address transition detecting signal is formed according to a transition of an address for accessing each of the non-volatile memory cells of the data memory block.

7. A non-volatile semiconductor memory device according to claim 1, wherein some of the non-volatile memory cells of the erase complete data memory region are used as a protect data memory region, and block protection data indicating a protection state of the data memory block is stored in the protect data memory region.

8. A non-volatile semiconductor memory device according to claim 7, wherein in response to an erase state confirmation signal and an address transition detecting signal, the reading element reads the erase complete data of the erase complete data memory region while reading the block protection data of the protection data memory region, where the erase state confirmation signal is predetermined, and the address transition detecting signal is formed according to a transition of an address for accessing each of the non-volatile memory cells of the data memory block.

9. A non-volatile semiconductor memory device according to claim 1, further comprising a protect data memory region including a plurality of non-volatile memory cells on which erase operation is performed separately from the non-volatile memory cells of the data memory block and the non-volatile memory cells of the erase complete data memory region, wherein block protection data indicating a protection state of the data memory block is stored in the protection data memory region.

10. A non-volatile semiconductor memory device according to claim 9, wherein the reading element reads the erase complete data of the erase complete data memory region in response to an erase state confirmation signal and an address transition detecting signal while reading the block protection data of the protection data memory region, where the erase state confirmation signal is predetermined, and the address transition detecting signal is formed according to a transition of an address for accessing each of the non-volatile memory cells of the data memory block.

11. A non-volatile semiconductor memory device according to claim 1, further comprising a redundant element for replacing one of bit lines used for reading data in the non-volatile memory cells of the data memory block with a redundant bit line, wherein:

each of the bit lines of the data memory block and each of bit lines used for reading data in the non-volatile memory cells of the erase complete data memory region are mutually used; and whenever the bit line of the data memory block is replaced with the redundant bit line, the bit line of the erase complete data memory region which is mutually used with the bit line of the data memory block is also replaced with the redundant bit line.

12. A non-volatile semiconductor memory device according to claim 11, wherein, when reading data in the non-volatile memory cells of the erase complete data memory region, the bit line of the erase complete data memory region replaced with the redundant bit line is blocked.

13. A non-volatile semiconductor memory device according to claim 11, wherein, when reading data in the non-volatile memory cells of the erase complete data memory region where the bit line of the erase complete data memory region is replaced with the redundant bit line, a bit from the redundant bit line is ignored, and whether or not data in the non-volatile memory cells of the data memory block is successfully erased is determined based only on bits read from other bit lines of the erase complete data memory region.

* * * * *